United States Patent [19]
Chiu et al.

[11] Patent Number: 5,241,423
[45] Date of Patent: Aug. 31, 1993

[54] HIGH RESOLUTION REDUCTION CATADIOPTRIC RELAY LENS

[75] Inventors: George L. Chiu, Cross River, N.Y.; Rama N. Singh, Bethel, Conn.; Janusz S. Wilczynski, Ossining, N.Y.

[73] Assignee: International Business Machines Corporation, Armonk, N.Y.

[21] Appl. No.: 738,971

[22] Filed: Aug. 1, 1991

Related U.S. Application Data

[63] Continuation-in-part of Ser. No. 551,116, Jul. 11, 1990, Pat. No. 5,089,913.

[51] Int. Cl.$^5$ .............................................. G02B 17/00
[52] U.S. Cl. ..................................... 359/727; 359/720; 359/726
[58] Field of Search ............... 359/727, 729, 726, 720, 359/831, 833, 834, 618, 625

[56] References Cited

U.S. PATENT DOCUMENTS

| | | |
|---|---|---|
| 2,166,102 | 7/1939 | Wild . |
| 2,815,695 | 12/1957 | Scharj et al. ..................... 359/727 |
| 3,001,448 | 9/1961 | Day . |
| 3,536,380 | 10/1970 | Ferguson . |
| 3,677,621 | 7/1972 | Smith ............................ 359/727 |
| 3,712,711 | 1/1973 | Adachi ........................... 350/164 |
| 3,748,020 | 7/1973 | Fischer et al. ................... 350/445 X |
| 4,128,303 | 12/1978 | Onoki et al. ..................... 350/164 |
| 4,171,871 | 10/1979 | Dill et al. ........................ 350/445 X |
| 4,195,908 | 4/1980 | Kestigian et al. ................. 350/445 X |
| 4,199,226 | 4/1980 | Weber et al. ..................... 350/445 X |
| 4,265,529 | 5/1981 | Yokota . |
| 4,311,366 | 1/1982 | Clark et al. . |
| 4,387,969 | 6/1983 | Nishioka et al. . |
| 4,444,464 | 4/1984 | Minott . |
| 4,694,151 | 9/1987 | Yoshimura . |
| 4,742,376 | 5/1988 | Phillips . |
| 4,743,103 | 5/1988 | Estelle . |
| 5,089,913 | 2/1992 | Singh et al. ..................... 359/727 |

FOREIGN PATENT DOCUMENTS

| | | |
|---|---|---|
| 2802285 | 3/1978 | Fed. Rep. of Germany . |
| 292125 | 10/1953 | Switzerland ..................... 350/164 |

OTHER PUBLICATIONS

Copy of Rosenbluth application filed Apr. 22, 1988, Ser. No. 07/185,187 along with Info. Discl. Statement for Rosenbluth appl. and prior art cited by Examiner.

Primary Examiner—Bruce Y. Arnold
Assistant Examiner—Hung Xuan Dang
Attorney, Agent, or Firm—Daniel P. Morris

[57] ABSTRACT

An optical system of a NX reduction catadioptric relay lens having sub-half micron resolution over the ultraviolet band width is described. A spherical mirror with a stop at the mirror is used to work at substantially the desired reduction ratio and the desired high numerical aperture sufficient to provide the desired high resolution. A beam splitting cube with appropriate coatings is used to form an accessible image of an object on an image plane. Refracting correctors in the path of the slow beam incident on the mirror and in the path of the fast beam reflected on the mirror are designed to fix the aberrations of the image formed by the mirror. The beam splitter coatings are chosen in such a way that beams reflected from and transmitted therethrough suffer no net aberration as a result of multiple reflections within the thin film beam splitter coatings and therefore are substantially free of aberration, distortion and apodization which would result from the beam splitting surface in the absence of these coatings.

10 Claims, 12 Drawing Sheets

CYCLES / MM

HIGH RESOLUTION REDUCTION CATADIOPTRIC RELAY LENS

This application is a continuation-in-part application of U.S. application Ser. No. 07/551,116 filed Jul. 11, 1990 now U.S. Pat. No. 5,089,913.

CROSS REFERENCE TO A RELATED APPLICATION

U.S. application Ser. No. 07/185,187 filed Apr. 22, 1988 entitled "Thin Film Beam Splitter Optical Element For Use In An Image-Forming Lens System" to A. E. Rosenbluth describes a beam splitter optical element, including a triangular substrate, such as a prism having a plain face corresponding to the hypotenuse of the prism which is coated with a thin film structure having materials and thickness, which effect the division of each light beam such as into a reflected and transmitted portion in such a way, that the beam suffers no net aberration as a result of multiple reflection in the thin film structure and a second triangular substrate, such as a prism having a plain face, corresponding to the hypotenuse, optically bonded to the thin film structure deposited on the hypotenuse of the first prism.

FIELD OF THE INVENTION

This invention relates to a catadioptric relay lens, particularly to a high resolution reduction catadioptric relay lens containing a beam splitting surface and a curved reflecting surface, more particularly to a 4X and a 5X reduction catadioptric relay lens having a submicron resolution at ultra-violet wavelengths.

BACKGROUND OF THE INVENTION

In the fabrication of microelectronic components, for example, semiconductor chips and semiconductor chip packaging substrates, increase in performance is generally achieved by reducing the image size of the electronic devices on the chips and by reducing the width and spacing of the electrical conductors of the wiring planes of the semiconductor chip and semiconductor chip packaging substrate. Reduced image size and spacing is achievable by using improved optical systems to project higher resolution images.

Generally, an optical system for fabricating an electronic component has a mask containing a pattern at the input of the optical system through which light of a preselected frequency is passed. The optical system contains a component, typically a lens to reduce the size of the patterns in the mask which is projected as a reduced image onto the surface of an electronic component. A reduction system is used to reduce the width and spacings of the patterns on the mask. The image is typically projected onto a resist material on the surface of the electronic component. The light projected onto the resist material causes a chemical change therein which either renders the exposed regions soluble or insoluble with respect to the un-exposed regions of the resist. The soluble regions are removed by exposing the resist to a solvent leaving a pattern which is either the positive or negative image of the mask reduced in size.

The reducing system is used to reduce the size of the patterns on the mask and to demagnify imperfections in the structure. The use of an optical system for producing a reduced image of the mask introduces distortions referred to as aberrations which are inherent in the optical components of the system.

Prior art reduction systems employed in tools known as steppers use a series of lenses to reduce the mask image and to correct the various commonly known aberrations of an optical system. However, the applicants have discovered that by using a curved mirror to provide the predominant fraction of the reducing power of the optical system, the inherent aberrations of the optical system can be corrected more effectively and with fewer optical components.

The preferred curved surface is a concave spherical mirror. A problem with using a spherical mirror in place of a lens for reducing the mask size is that the projected image of the mask is reflected back from the mirror towards the direction of the mask. Such an image cannot be easily used since the substrate on 7hich the image is to be projected must be placed in the path of the optical beam which is incident on the spherical surface. This effectively prevents a useful image from being formed using the full field of the mirror. Therefore, such systems typically use reflecting surfaces to split the mirror field of view, into a field for the object being focused and a field for the substrate on which the image of the object is focused. In such systems the size of the substrate object being imaged is constrained since the object and the image can only occupy one half the total field of the focusing mirror. The field of the focusing mirror is that region of an object or image field, over which the mirror, in conjunction with the remainder of the optical system, can properly form images.

Applicants have discovered that by using an appropriate beam splitting surface the output beam can be directed away from the input beam so that the output beam can be used to project an image onto a substrate.

The beam transmitted through and reflected from the beam splitting surface must be substantially free of distortion, aberration and apodization as a result of passing through or being reflected from the beam splitting surface. Beam splitting surfaces suitable for the optical systems of the present invention are described in U.S. patent application Ser. No. 07/185,187 filed on Apr. 22, 1988 entitled "Thin Film Beam Splitter Optical Element For Use In An Image-Forming Lens System" to A. E. Rosenbluth, the teaching of which is incorporated herein by reference.

U.S. Pat. No. 4,444,464 to Minott describes a catadioptric optical system having two symmetrically aligned off-axis Schmit optical objectives. Incident light is reflected from two primary spherical mirrors off the axis of the incident light. The light from each mirror is reflected from a beam splitter which separates the light into a plurality of spectral bands.

U.S. Pat. No. 4,694,151 describes a mirror free auto focus system having a half mirror prism and a sensor capable of detecting light in conjunction with the half mirror prism inserted between the front lens and rear lens group of the lens system.

U.S. Pat. No. 4,311,366 describes an image focusing system free of curved mirrors for use in a reprographic camera containing a flat mirror or prism or roof prism for folding an input beam. The input beam and output beam pass through lens combinations providing focusing and aberration correction.

U.S. Pat. No. 4,265,529 describes a view finder for a camera including an input lens, a flat reflecting mirror, a roof type pentagonal mirror and an eye piece.

U.S. Pat. No. 3,536,380 describes a 1X catadioptric projection system for semiconductor chip photolithographic applications. Light is directed through a lens, through a mask, onto a half silvered mirror from which it is reflected through a lens onto a concave mirror from which it reflects onto the target substrate.

U.S. Pat. No. 4,387,969 described an optical system having an objective lens group, a beam splitting prism which deflects light at a right angle through a lens to focus an image on a film.

U.S. Pat. No. 2,166,102 describes a telescope having an objective lens and using a prism or a plain mirror to reflect light at an angle to a concave mirror.

U.S. Pat. No. 3,001,448 describes a system using a beam splitter for correcting astigmatism produced by a shallow dome by introducing positive stigmatism by using rotating prism.

U.S. Pat. No. 4,742,376 describes a step and repeat system which uses a Dyson-Wynne catadioptric projection system.

U.S. Pat. No. 4,743,103 describes a lens system for a photographic printer which rotates the image through 90 degrees without effecting the inversion needed in a printer lens.

It is an object of this invention to provide an optical projection system with an extended field which will faithfully reproduce submicron geometries over a large substrate area.

It is another object of this invention to provide a substantially telecentric reduction catadioptric relay lens with diffraction limited performance over the ultraviolet bandwidth, most preferably of an excimer laser.

It is another object of the invention to exploit the very sensitive deep UV resists and highly intense excimer laser beams for the optical microlithography for microelectronic integrated circuits by sacrificing net transmittance of the optical system which is a consequence of employing the beam splitting technique to form an accessible and useful image.

It is another object of this invention to extend the limits of optical microlithography to quarter micron resolution by employing a high numerical aperture with partially coherent illumination of the mask improving the recordability of the image due to the resulting enhancement of contrast beyond the limit of 49% for incoherent 248 nm illumination in the case of an aberration free in focus lens at a numerical aperture of 0.6.

These and other objects, features and advantages will be apparent from the following more particular description of the preferred embodiments and the figures appended thereto.

SUMMARY OF THE INVENTION

In its broadest aspect the present invention is a catadioptric relay lens system.

In a more specific aspect of the present invention, the lens system is a reduction system.

Another more specific aspect of the present invention is an optical system containing an optical element formed from a material capable of supporting propagation of image forming beams of radiation. The optical element has at least one substantially planar surface. A plurality of thin film coatings are disposed on the substantially planar surface to provide a beam, reflected from the surface or transmitted through the surface which is substantially free from aberration, distortion and apodization due to reflection from and transmission through the surface. The system also contains a concave reflective surface for receiving a beam reflected from or transmitted through the substantially planar surface. The system contains an input and output lens group to substantially correct for aberrations arising from reflection at the concave reflective surface.

In another more particular aspect of the present invention, an input beam reflects off the substantially planar surface to a concave reflective surface from which it is reflected back through the substantially planar surface and focused at the output onto a target.

In another more particular aspect of the present invention, the input beam passes through the substantially planar surface onto the concave reflective surface from where it is reflected back to the substantially planar surface from which it is reflected off the axes of the input beam and focused at the output onto a target.

In another more particular aspect of the present invention, the optical system is NX reduction system where N is greater than one.

In another more particular aspect of the present invention, the optical system is a mask projection system for projecting and reducing a predetermined pattern in the mask onto a target substrate.

In another more particular aspect of the present invention, the optical system has sub-micron resolution over the total ultraviolet bandwidth of an illumination source, in particular the ultra-violent bandwidth of an excimer laser.

In another more particular aspect of the present invention, the plurality of thin film coatings are composed of materials having substantial uniform thickness over the substantially planar surface to produce a self-compensating phase distribution and a self-compensating amplitude distribution in the beam reflected from the substantially planar surface and in the beam transmitted through the substantially planar surface, the resulting phase and amplitude distributions of the beam reflected from and transmitted through are then substantially free from distortion, aberration and apodization.

These and other objects, features and advantages will become apparent from the following more particular description of the preferred embodiments and the figures appended thereto.

DETAILED DESCRIPTION OF THE PREFERRED EMBODIMENT

Figure 1:
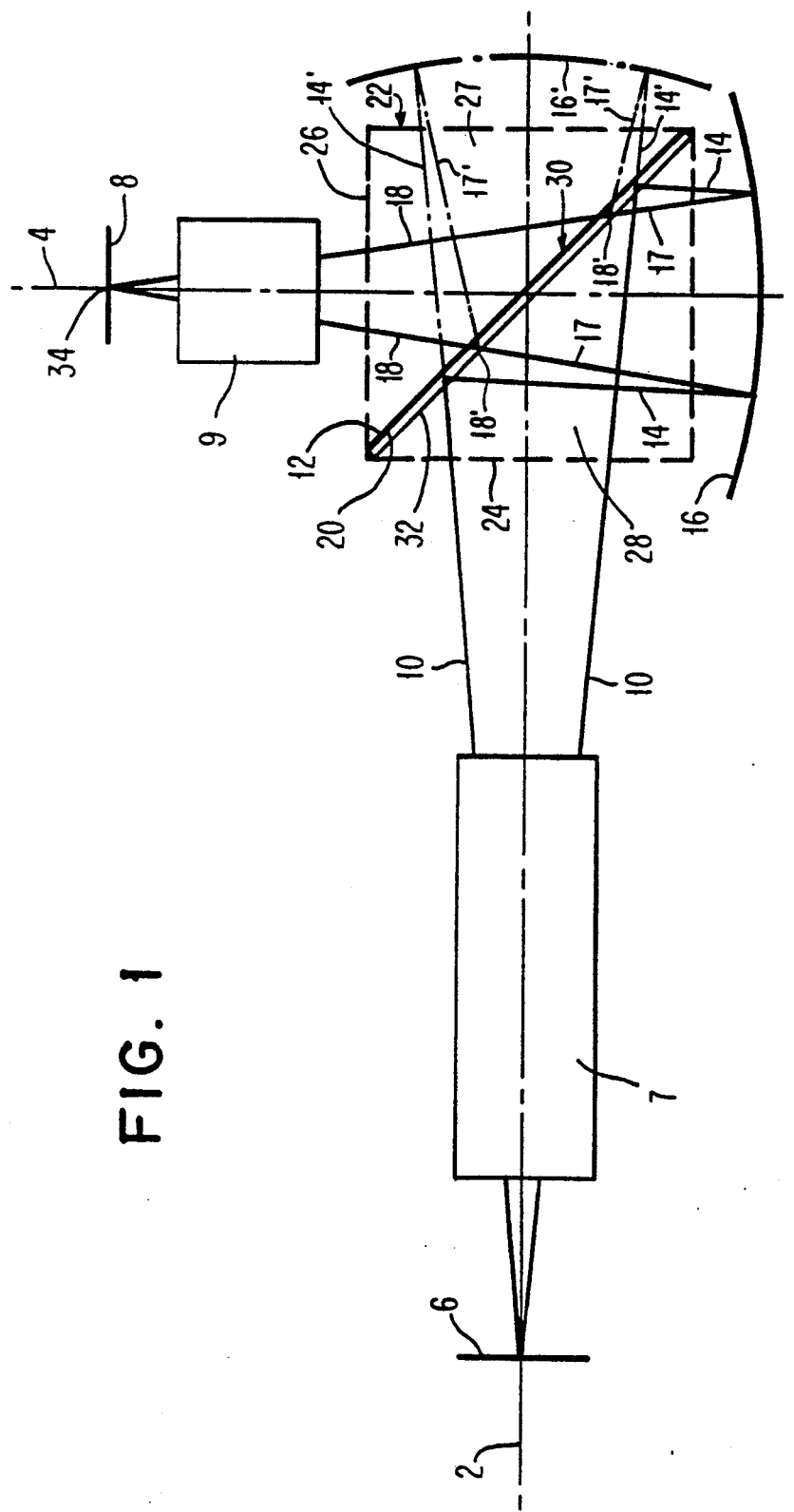
FIG. 1 is a schematic representation of the optical system of the present invention.

FIG. 1 shows a schematic representation of an optical system according to the present invention. FIG. 1 shows several related optical systems; one in dark lines; another in phantom and a third which is a combination having an enhanced optical throughput according to the present invention. For convenience the inventions will be described in terms of the system schematically show in FIG. 1 in dark lines. Use of the other systems will be apparant from the discussion herein. The apparatus of FIG. 1 has an input axis 2 and an output axes 4 which are not colinear; in the preferred embodiment axis 2 and 4 are perpendicular. Radiation is directed along input axis 2 towards an object 6 to be imaged at target 8. The radiation is preferably ultraviolet light, most preferably the output of KrF excimer laser operating at 248 nm wavelength. In the preferred embodiment of the present invention object 6 to be imaged is a mask having regions transparent and regions opaque in a predetermined pattern to the radiation incident along the input axis 2. Radiation 10 passing through object 6 is incident on substantially planar surface 12 which transmits a fraction of the incident light and reflects a fraction of the incident light represented by 14 towards a concave reflective surface 16 which is the aperture stop of the optical system. Beam 14 reflects off of surface 16 as radiation 18 along the output axis 4 to be focused upon target 8. In the preferred embodiment target 8 is an electronic component, for example, a semiconductor chip or a semiconductor chip packaging substrate having thereon a resist material. The image of the mask 6 is focused upon the resist material at target 8 forming an exposed pattern in the resist. Depending upon whether the resist is a positive or a negative resist, the exposed regions are either made soluble or insoluble with respect to the unexposed regions. In the preferred embodiment the exposed regions or the image of the mask has submicron resolution, preferably in the sub-half-micron range, most preferably in the 0.25 micron range. To achieve such fine resolution in the projected image distortions, aberrations and apodization introduced into beam 14 reflected from surface 12 and beam 18 transmitted through surface 12 must be substantially eliminated. This is achieved by using thin film coatings 20 disposed on surface 12. A surface having thin film coatings thereon useful to practice the present invention are described in U.S. patent application Ser. No. 07/185,187 to Rosenbluth, the teaching of which is incorporated herein by reference. As used herein reflections from film coating 20, such as beams 10, are show in FIG. 1 reflecting from the center of the thin film coatings. Due to the way the thin film coatings work this is an approximate geometrical representation. Rosenbluth provides a thin film structure that divides an incident beam into a beam reflected from the thin film structure and into a beam transmitted through the thin film structure without introducing aberration, apodization or illumination nonuniformities in the image field. In the preferred embodiment, beam splitting surface 12 is contained within beam splitting cube 22 so that input axis 2 is substantially perpendicular to face 24 of cube 22 and so that output axis 4 is substantially perpendicular to face 26 of cube 22.

For practical applications, there is a need for lithographic lenses that operate with wave lengths as short as 248 nm or below. However, at wavelengths below 300 nm, it becomes more difficult to design lithographic imaging systems whose only elements are conventional transparent lenses, due to material limitations.

Beam splitter optical element 22 contains a prism 22 whose hypotenuse face 30, is coated by conventional processes with a thin film structure having materials of thickness's, determined by means disclosed in the application of Rosenbluth, incorporated by reference herein above, which affect the desired division of each light beam such as 10 into a reflected portion 14 and a transmitted portion 18 in such a way that the beams suffer no net aberration as a result of multiple reflections within the thin film structure. A second substrate, such as prism 28 whose face 32 corresponding to the prism hypotenuse, is bonded through conventional means to the thin film structure disposed on the hypotenuse of prism 26 to form beam splitting optical element 22.

Most dividing films will introduce significant variations across the angular divergence of beams such as 10, due to the intrinsic angular dependence of the optical properties of thin films. This angular dependency is most pronounced when the films are tilted relative to the central axis 2 of the beam. Beam 10 is projected from object 6 to prism face 32. A reflected portion 14 of beam 10 is then propagated to mirror surface 16. The fraction of the beam that is reflected in this pass will be referred to as the first-pass beam splitter efficiency.

After being focused, beam 10 is again incident for a second pass at the thin film coating on prism face 32. The portion of incident beam 10 that is transmitted during this second pass is then focused to an image 34 on the substrate 8. The efficiency of this pass is equal to the transmitted fraction. Substrate 8 may be large enough to fully occupy the field of view of reflecting surface 16, rather than merely half the field as with reflecting mirrors in the prior art apparatus.

Thin film structure 20 forming the beam splitting surface must be tilted to divert incident beam 10 from the input axis 2 along the output axis 4. However, any tilts at entrance face 24 or exit face 26 of beam splitting element 22 will introduce aberrations in the imaging beams. Thus, in the preferred embodiments faces 24 and 26 are parallel to the object being imaged 6 and to the substrate on which the image is being projected 8 respectively so that the beam splitter element 22 forms a unitary structure with the shape of a cube in the preferred embodiment.

The input side of the apparatus schematically shown in FIG. 1 is from object plane to curved reflecting surface 16. The output side of the apparatus is from surface 16 to image plane 8. Rectangle 7 of FIG. 1 represents optical elements, such as lenses, which can be anywhere on there input side and rectangle 9 represents optical elements which can be anywhere on the output side. The optical elements represented by 7 and 9 correct for aberrations introduced by the optical elements, the curved surface 16 and the beam splitting element 22.

FIG. 1 shows an alternative optical system in phantom wherein the beam transmitted through coatings 20 is reflected from concave reflecting surface 16'. Concave reflecting surface 16' is the same as concave reflecting surface 16. Surface 16' is spaced the same distance from coatings 20 as surface 16 is spaced from coatings 20. Only a fraction of beam 10 reflects from coating 20 on surface 12 as beam 14. The remainder of beam 10 is transmitted through coating 20, surface 12 as beam 14' which is reflected from surface 16' back to coating 20 on surface 12 from which it is reflected towards object 8. Either the reflected beam 14 or the transmitted beam 14' can be used to project an image at object 8. Alternatively, beam 14' and beam 14 can be used by using both reflecting surfaces 16 and 16'. Beams 17 and 17' recombine at 18' to form beam 18. Beam 18 has thereby been enhanced, typically to 2×, by the use of concave reflecting surfaces 16 and 16'. The optical outputs of all of the embodiments described herein can be enhanced by using two concave reflecting surfaces to direct at the target the beams transmitted through and reflected from the planar transmitting and reflecting surface.

Figure 2:
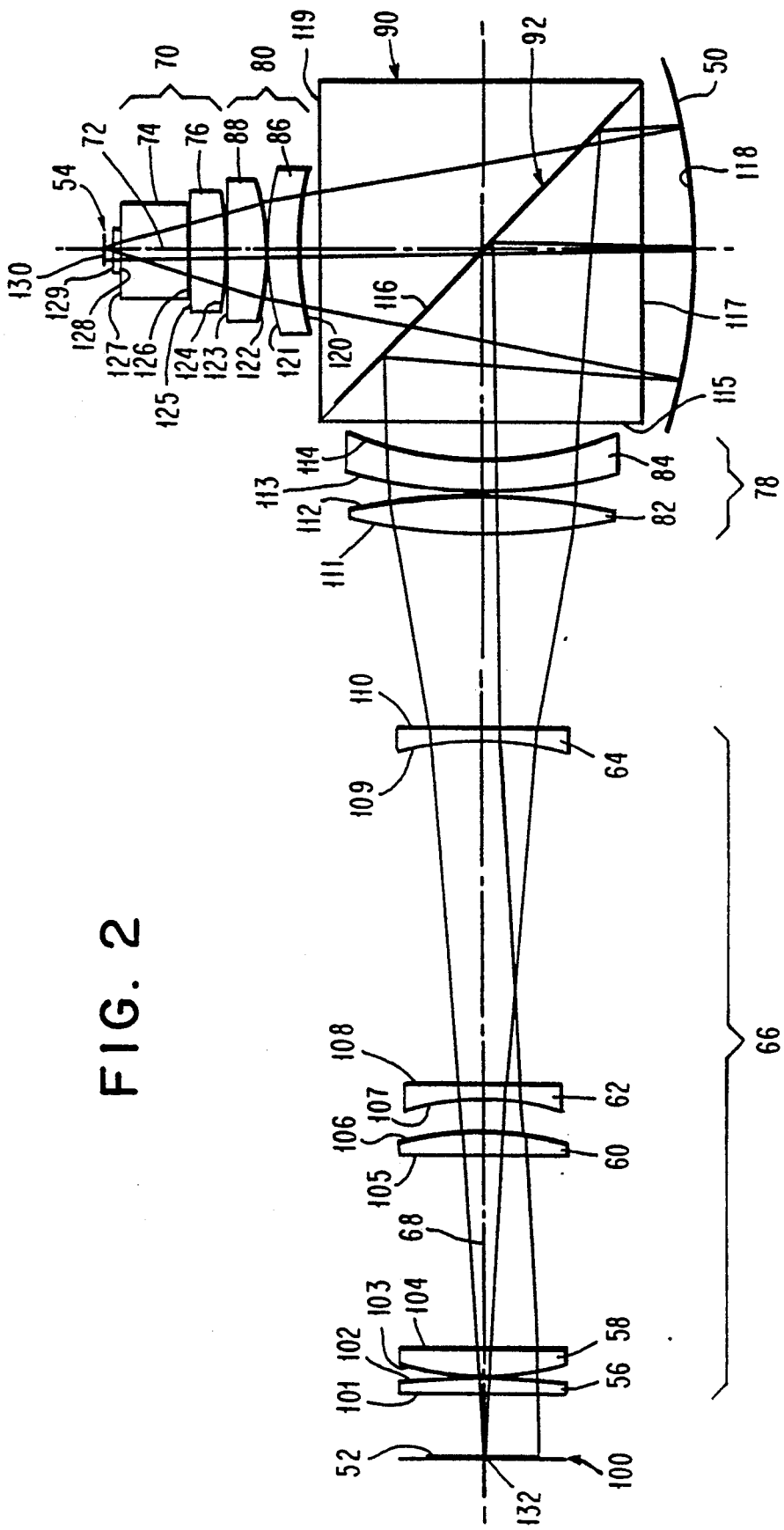
FIG. 2 is a specific embodiment of the apparatus schematically shown in FIG. 1 for a 5× reduction system.

FIG. 2 is a specific embodiment of an optical design of a 5× optical reduction catadiotric relay lens having sub-micron resolution over the total ultra-violet bandwidth of an excimer laser. A spherical primary mirror with a stop at the mirror is used to work at substantially the desired reduction ratio and the desired high numerical aperture sufficient to provide substantially the desired high resolution. A beam splitting cube of fused silica with appropriate coatings is provided to form an accessible image of an object which represents a mask used to pattern a wafer located at the image. Refracting correctors in the path of the slow incident beam on the mirror and also in the path of the fast reflected beam from the mirror are designed to fix the aberrations of the image formed by the mirror.

The spherical concave mirror 50 is used at conjugates giving substantially the desired reduction ratio of 5 with field flatting provided by separate refractive correctors placed in the proximity of the object plane 52 and image planes 54. Lenses 56, 58, 60, 62 and 64, form an air space refracting group 66 on the long conjugate side 68 of mirror 50. Air space refracting group 66 is complemented by compact compound field corrector group 70 on the short conjugate side 72 of mirror 50. Field corrector group 70 is made up of lens 74 and 76. The lens combination 66 on the input axes and lens combination 70 on the output axes correct for field curvature of the mirror 50. Spherical aberration arising at reflection /n the mirror 50 is corrected by providing separate compound correctors 78 on the input axes 68 and 80 on the output axes 72. Corrector 78 is made up of lens 82 and 84. Corrector 80 is made up of lens 86 and 88.

The substantially symmetrical disposition of correctors 66, 78 on the input axes 78 and correctors 70 and 80 on the output axes about the mirror 50, which is also used as a stop, allows excellent coma correction of the optical system. The optical system is designed with beam splitting cube 90 in its path to permit the image forming beams of light to clear the incident beam on the mirror thereby requiring a two pass use on the optical path in the glass of the beam splitting cube. Without this arrangement, there will always be present an obstruction in the pupil which is not recommended to be used in optical microlithography principally on account of variation in the size of obstruction with field leading to non-uniform exposure dose falling on the silicon wafer.

The design of FIG. 2 has a high numerical aperture of approximately 0.6. This permits a high resolution reaching a quarter micron resolution. However, the field of the object 52 covered depends on the scale on which the beam splitting cube 90 and thin film coatings on beam splitting surface 92 may be successfully fabricated.

Table 1 lists the preferred constructional parameters of the embodiment of FIG. 2 for a 5× reduction catadioptric relay lens having numerical aperture of 0.6 at the output and a circular field on the image side 52 of diameter 14.4 millimeters sufficient to cover a one square centimeter area. Table 1 lists the surfaces shown in FIG. 2, the radius of a curvature of the surface in millimeters. The thickness or separation from one surface to the next surface and the index of refraction between these surfaces, for example the spacing between surface 100 and 101 is 2.6936 millimeters and the index of refraction between surfaces 101 and 102 is 1.508807. Table 1 also lists one half the diameter of each refracting surface.

TABLE I

|  | Surface | Radius Curvature mm | Thickness mm | Index of Refraction n = 1.5085507 a = 1.0 | One Half Diameter of Surface mm |
|---|---|---|---|---|---|
| Mask | 100 |  | 2.6936 | a | 36.0 |
|  | 101 | 416.1907 | 15.6 | n | 36.8 |
|  | 102 | −352.6095 | 0.1 | a | 37.9 |
|  | 103 | 216.3507 | 9.9996 | n | 38.4 |
|  | 104 | −9143 | 100 | a | 38.4 |
|  | 105 | 165.0775 | 6.0 | n | 37.5 |
|  | 106 | −141.8095 | 6.4339 | a | 37.8 |
|  | 107 | −544.5087 | 9.0 | n | 37.5 |
|  | 108 | 276.6342 | 158.9991 | a | 37.5 |
|  | 109 | −106.1731 | 5.0 | n | 48.2 |
|  | 110 | −221.0308 | 95.9982 | a | 50.5 |
|  | 111 | 7177.482 | 15.0 | n | 71.4 |
|  | 112 | −235.2796 | 3.0 | a | 71.9 |
|  | 113 | −253.3041 | 15.0 | n | 72.0 |
|  | 114 | −367.28 | 18.0 | a | 74.0 |
| Cube Face | 115 |  | 75.0 | n |  |
| Cube Diagonal | 116 |  | 75.0 | n |  |
| Cube Face | 117 |  | 24.0 | a |  |
| Mirror | 118 | 322.0703 | 24.0 | a | 88.0 |
| Cube Face | 117 |  | 75.0 | n |  |
| Cube Diagonal | 116 |  | 75.0 | n |  |
| Cube Face | 119 |  | 9.00 | a |  |
|  | 120 | −267.7909 | 15.0 | n | 44.1 |
|  | 121 | −313.664 | 1.0 | a | 41.1 |

TABLE I-continued

| Surface | Radius Curvature mm | Thickness mm | Index of Refraction n = 1.5085507 a = 1.0 | One Half Diameter of Surface mm |
|---|---|---|---|---|
| 122 | 80.2329 | 16.4981 | n | 36.6 |
| 123 | 328.6877 | 5.8627 | a | 32.7 |
| 124 | 110.6656 | 18.0 | n | 27.9 |
| 125 | 56.8994 | 4.8224 | a | 19.3 |
| 126 | 65.4243 | 18.0 | n | 17.3 |
| 127 | −425.502 | 1.5 | a | 10.3 |
| 128 | −212.3753 | 3.0 | n | 9.2 |
| 129 | −756.9179 | .7043 | a | 7.8 |
| Target 130 | | | | |

The kinds of glasses used in constructing lenses of the optical system according to the present invention hardly have limitations. Glasses must only transmit well at the wavelengths desired for the specific application. The design of FIG. 2 and Table 1 is for a wavelength of 248 nm and all lenses are made of fused silica. However, the lenses may be achromatised in the usual manner by adding glasses of differing dispersions to the field correcting and spherical aberration correcting lens groups and in applications where such a choice of glass exists.

The size of the field achievable by the embodiment of FIG. 2 and Table 1 enables its use primarily in the tools of optical microlithography known as steppers but does not prevent it from being applied in scanners of the ring field type or of the slot field type and will actually be of significant importance in the tools that combine stepping and scanning to print wafers of very large size.

Figure 3:
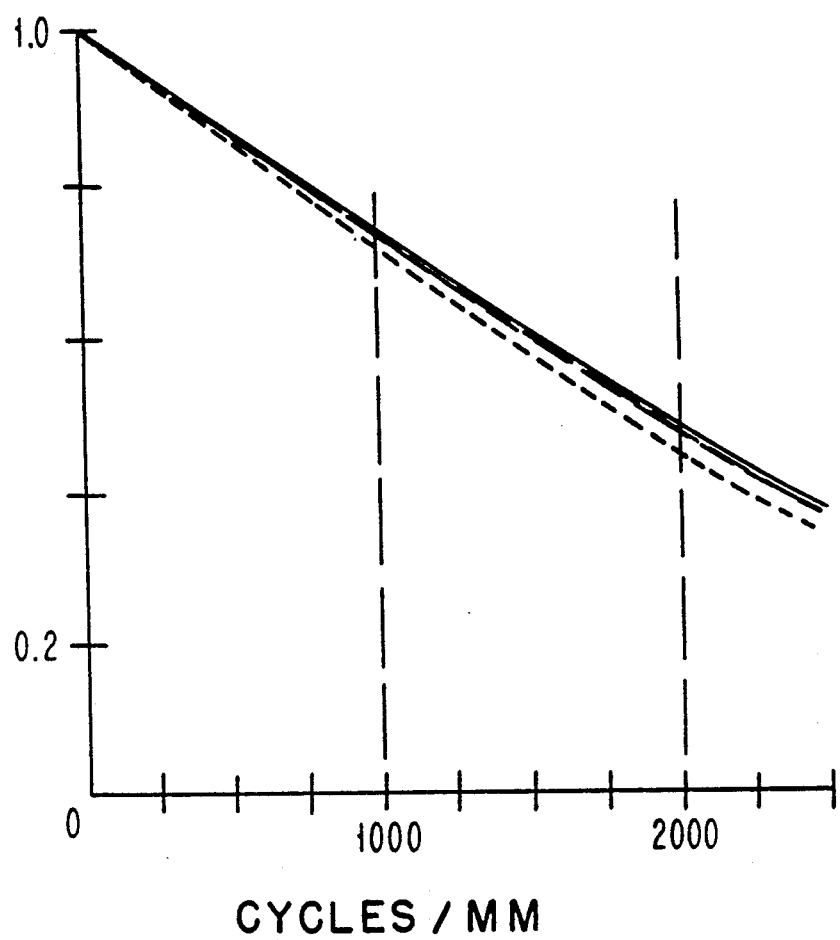
FIG. 3 is a plot of the modulation transfer function (MTF) as a function of spatial frequency for the apparatus of FIG. 2.

For the embodiment of FIG. 2 and Table 1, FIG. 3 gives the modulation transfer function as a function of spatial frequency for both tangential and sagittal features for three regions of the optical system: one at a point 132 where the input axes 68 intersects the object plane 100; another point at 0.7 of the full field away from the point 132 with input axes 68 intersects the object plane 100; and, a third point at the full field away from the point where the input axes 68 intersects the object plane 100. As can be seen from FIG. 3 the modulation transfer function for the trangential and sagittal features at these three points are almost identical.

Figure 4:
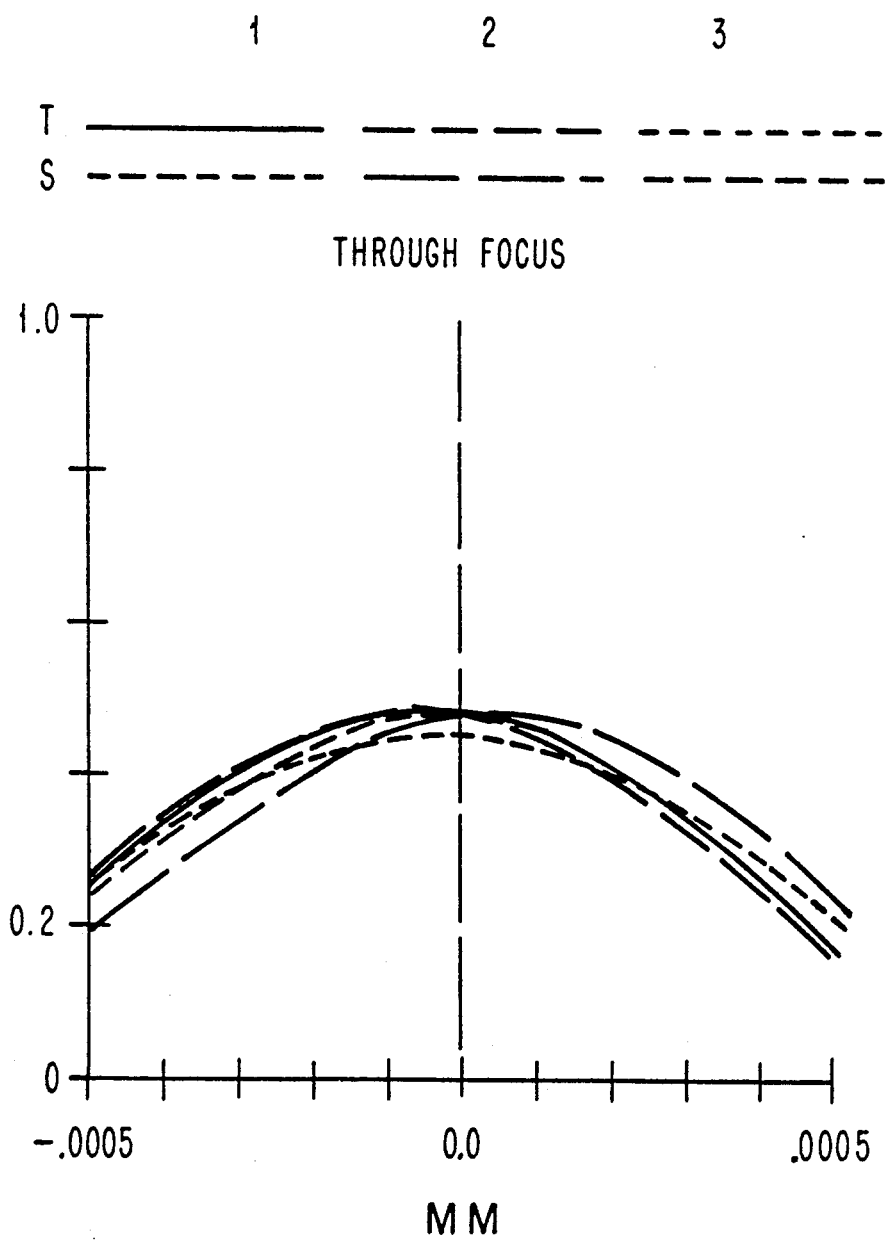
FIG. 4 is a plot of through-focus MTF at a through focus frequency of 2,000 cycles per mm for the apparatus of FIG. 2.
Figure 5:
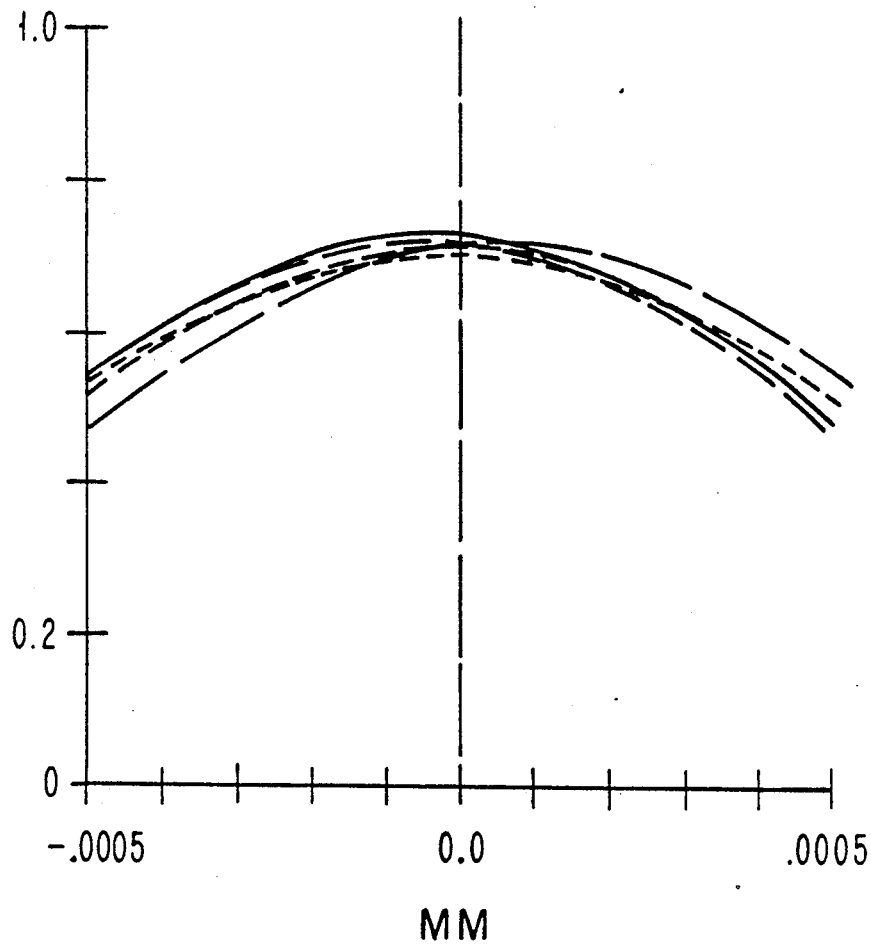
FIG. 5 is a plot of the through focus at a frequency of 1,000 cycles per mm for the apparatus of FIG. 2.
Figure 6:
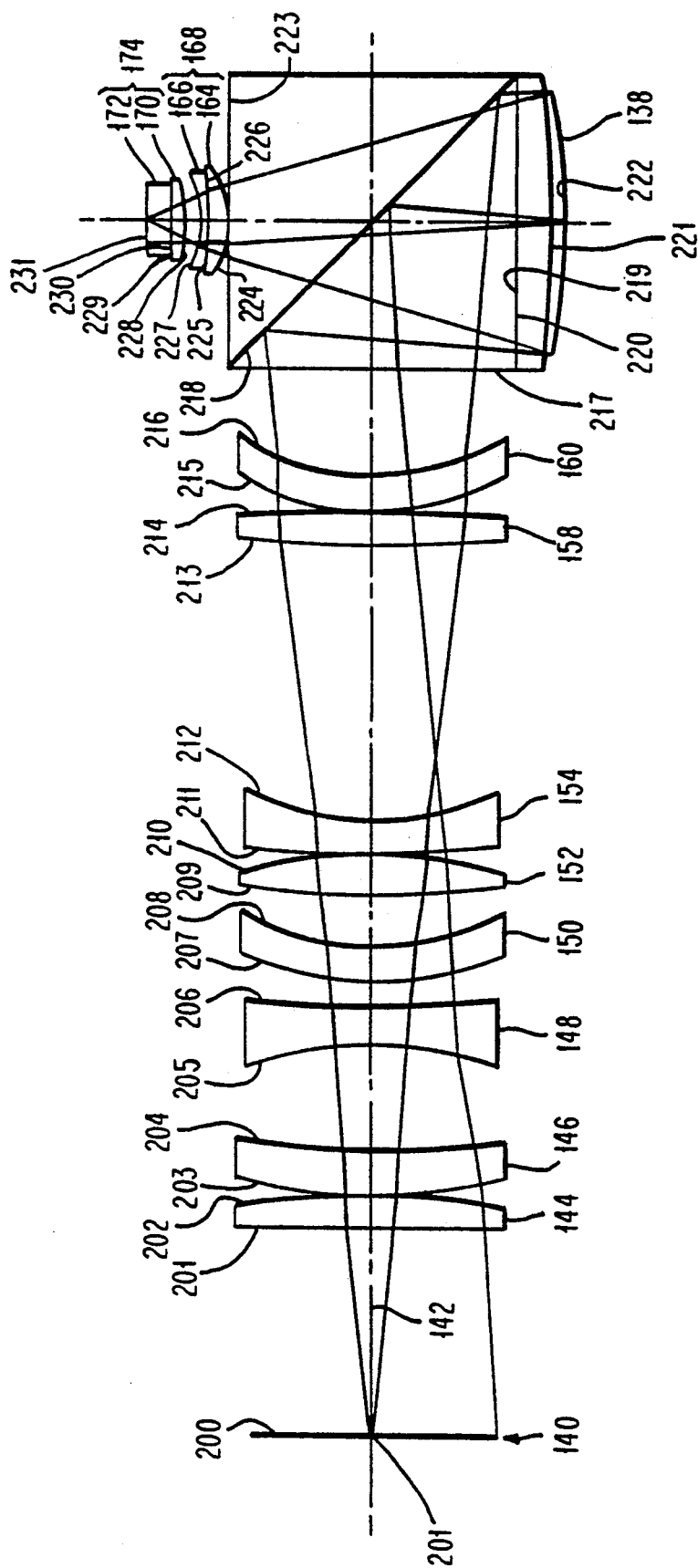
FIG. 6 is a specific embodiment of the apparatus schematically shown in FIG. 1 for a full field 5× reduction system.
Figure 7:
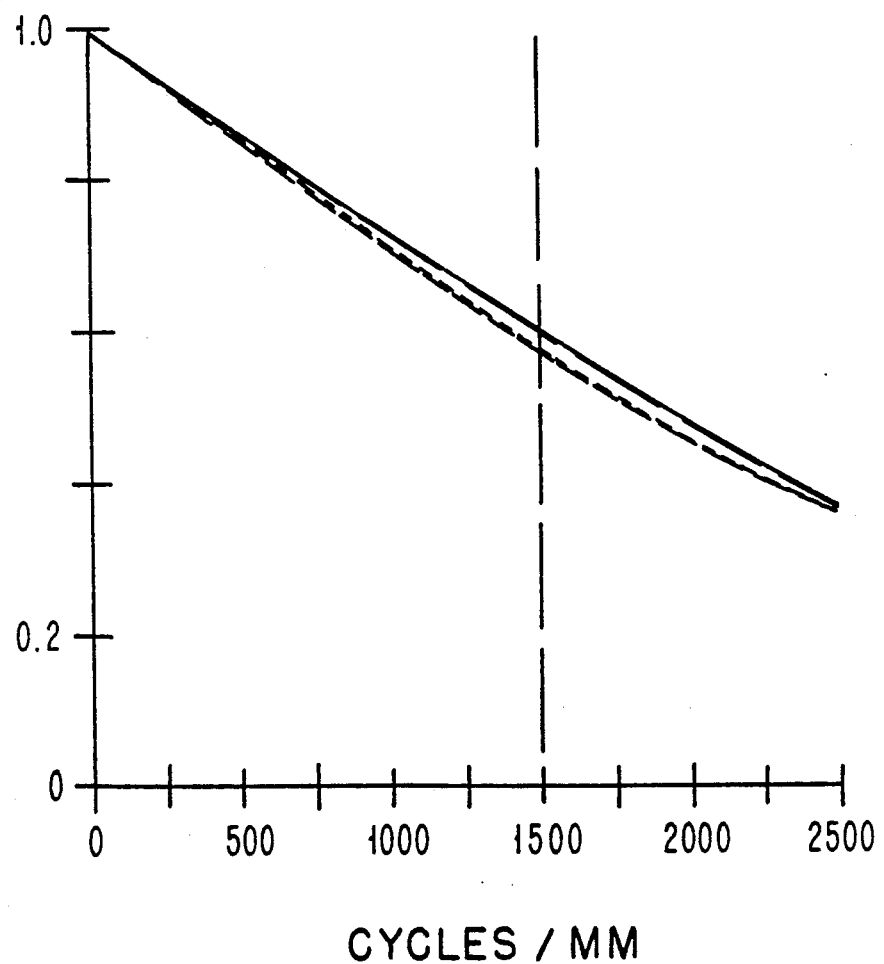
FIG. 7 is a plot of the modulation transfer function for the apparatus of FIG. 6.
Figure 8:
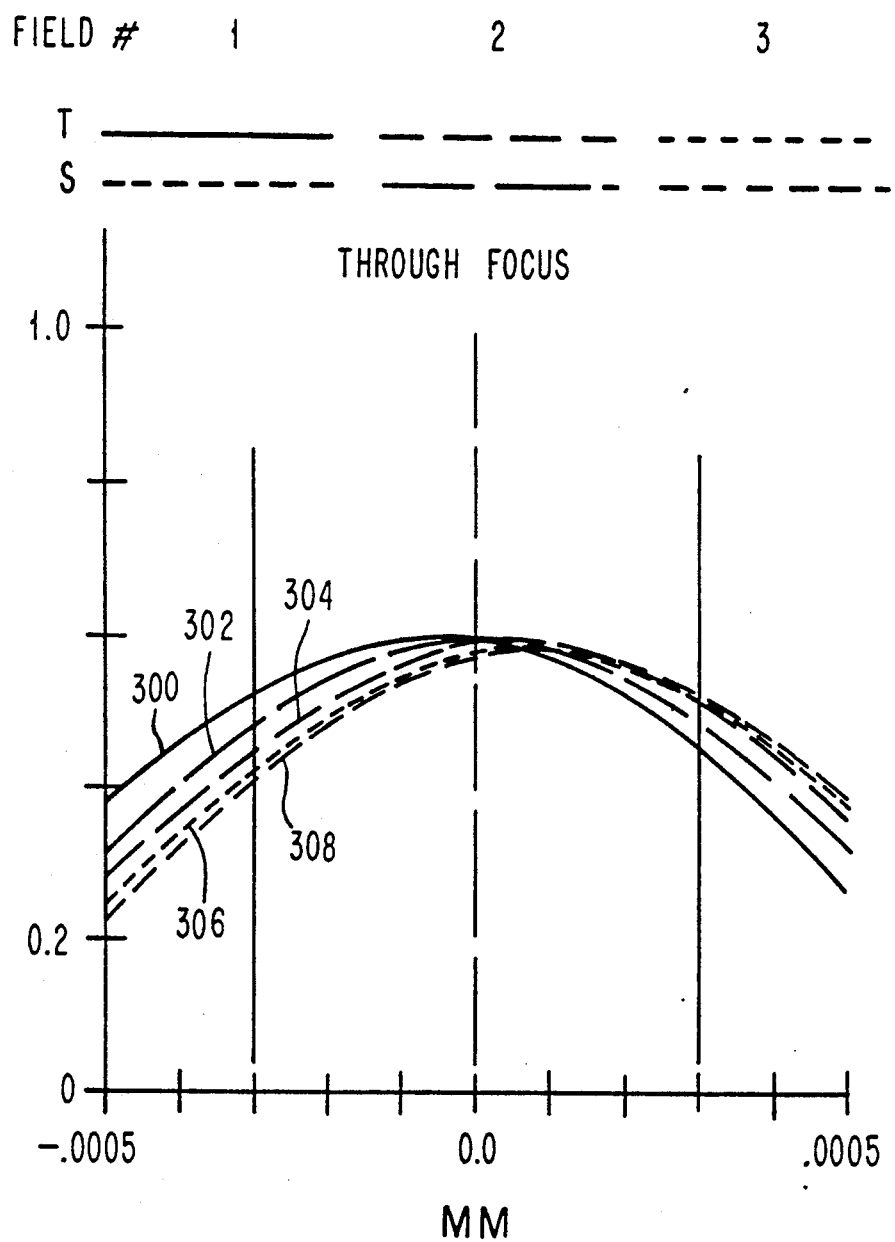
FIG. 8 is a plot of the through focus MTF at a frequency of 1,500 cycles per mm for the apparatus of FIG. 6.
Figure 9:
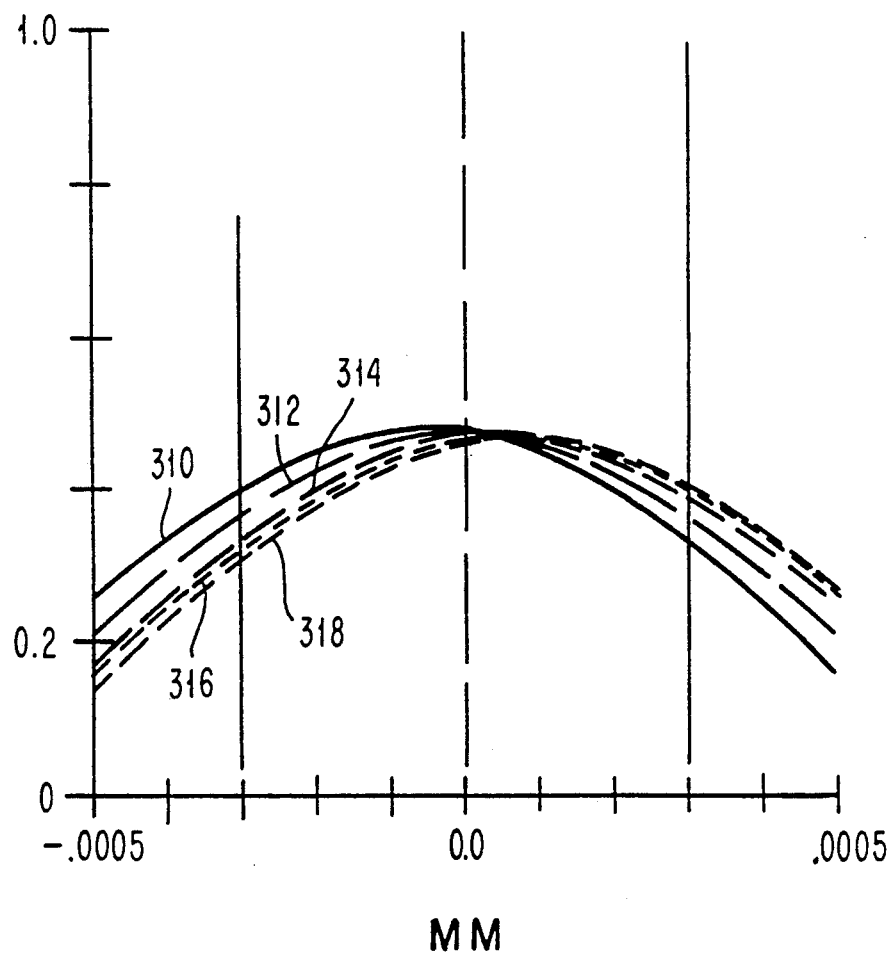
FIG. 9 is a plot of the through focus MTF at frequency of 2,000 cycles per mm for the apparatus shown in FIG. 6.

In FIG. 4 the through focus MTF for the tangential and sagital features at the three field points corresponding to modulation transfer functions plotted in FIG. 3 are shown for a MTF frequency of 2,000 cycles/mm. FIG. 5 provides the through focus MTF for the same conditions at frequency of 1,000 cycles/mm. As can be seen from FIGS. 4 and 5 there is little difference between the through focus MTF of the tangential and sagittal features for the three points plotted. FIG. 6 and Table 2 show another embodiment of an optical design of a 5× reduction catadioptric relay lens having submicron resolution over the total band width of a line narrowed deep UV excimer laser, for example, a KrF laser. The embodiment consists of a concave mirror and a beam splitting cube with appropriate coatings to produce accessible images of an object, such as a mask, with refracting correctors having certain preferred features of curvature relationship in both the slow incident beam to the mirror and the fast image forming beam reflected from the mirror, all of which cooperate to produce the highly corrected images with submicron features over an extended field. The constructional parameters of the embodiment of FIG. 6 and Table 2 have a numerical aperture of 0.6 for a circular field of diameter 30.0 mm sufficient to cover a 20 mm² image field. FIG. 7 is a plot of the MTF as a function of frequency for the embodiment of FIG. 6. FIG. 8 is a plot of through focus MTF at a frequency of 1,500 cycles/mm for the embodiment of FIG. 6. FIG. 9 is a plot of through focus MTF at a frequency of 2,000 cycles/mm for the embodiment of FIG. 6. FIG. 7, FIG. 8, and FIG. 9 plot the MTF for the tangential and sagittal features for a point on 201 axis, where the input axis 142 intersects the object plane, for a point at 0.7 of the full half field away from the point 201 and for a point at on axes the full half field of 15 millimeters. The off-axes values are given for both tangential and sagittal lines resulting in five curves in each of the plots of FIG. 7, FIG. 8 and FIG. 9. In FIG. 7 the five curves are essentially indistinguishable. In FIG. 8 curve 300 corresponds to the on axis tangential and sagittal features, curve 302 corresponds to the sagittal feature at 0.7 of the full field, curve 304 corresponds to the tangential feature at 0.7 of full field, curve 306 corresponds to the tangential feature at full field and curve 308 corresponds to the sagittal feature at full field. In FIG. 9 curve 310 corresponds to the on axis tangential and sagittial features, curve 312 corresponds to the sagittal feature at 0.7 of full field, curve 314 corresponds to the tangential features at 0.7 of full field, curve 316 corresponds to the tangential features at full field and curve 318 corresponds to the sagittal features at full field.

TABLE 2

| | Surface | Radius Curvature mm | Thickness mm | Index of Refraction n = 1.5085507 a = 1.0 | One Half Diameter of Surface mm |
|---|---|---|---|---|---|
| Mask | 200 | | 114.6494 | a | 75.1 |
| | 201 | 1792.5223 | 19.0019 | n | 81.9 |
| | 202 | −866.1057 | 0.0050 | a | 82.3 |
| | 203 | 322.7983 | 24.9952 | n | 82.1 |
| | 204 | 612.9103 | 94.9297 | a | 80.1 |
| | 205 | −365.5172 | 20.9984 | n | 73.7 |
| | 206 | 272.002 | 26.1477 | a | 74.4 |

TABLE 2-continued

|  | Surface | Radius Curvature mm | Thickness mm | Index of Refraction n = 1.5085507 a = 1.0 | One Half Diameter of Surface mm |
|---|---|---|---|---|---|
|  | 207 | 180.1773 | 20.9943 | n | 80.8 |
|  | 208 | 162.6329 | 26.7939 | a | 79.4 |
|  | 209 | 222.2809 | 35.0014 | n | 84.3 |
|  | 210 | −382.3895 | 0.0034 | a | 84.3 |
|  | 211 | 628.8815 | 19.0011 | n | 82.4 |
|  | 212 | 176.4534 | 97.4083 | a | 78.3 |
|  | 213 | 1180.4521 | 19.0039 | n | 83.0 |
|  | 214 | −1466.00 | 0.5012 | a | 83.2 |
|  | 215 | 165.2104 | 19.8943 | n | 83.0 |
|  | 216 | 144.1937 | 87.6403 | a | 78.9 |
| Cube Face | 217 |  | 85.00 | n |  |
| Cube Diagonal | 218 |  | 85.00 | n |  |
| Cube Face | 219 |  | 0.00 | a |  |
|  | 220 |  | 20.0 | n |  |
|  | 221 | 727.5375 | 7.4995 | a | 85.0 |
| Mirror | 222 | 354.6364 | 7.4995 | a | 83.9 |
|  | 221 | 727.5375 | 20.0 | n | 85.0 |
|  | 220 |  | 0.00 | a |  |
| Cube Face | 219 |  | 85.00 | n |  |
| Cube Diagonal | 218 |  | 85.00 | n |  |
| Cube Face | 223 |  | 1.00 | a | 37.4 |
|  | 224 | 60.0903 | 9.5832 | n | 33.2 |
|  | 225 | 112.4998 | 0.1 | a | 31.4 |
|  | 226 | 59.7906 | 4.9017 | n | 29.4 |
|  | 227 | 47.6875 | 5.6044 | a | 26.5 |
|  | 228 | 102.4535 | 7.511 | n | 26.0 |
|  | 229 | −602.3941 | 1.000 | a | 24.5 |
|  | 230 | −388.6705 | 19.6132 | n | 32.9 |
|  | 231 | −578.1068 | 0.5 | a | 15.5 |
| Target | 232 |  |  |  |  |

The kinds of glass used in constructing the embodiment of FIG. 6 hardly have limitations except that they must transmit well at the wavelengths desired for the specific application. The design is shown for a wavelength of 248 nm and all lenses are made of fused silica in the embodiment of Table 2. However, they may be achromatised in the usual manner by adding glasses at different dispersions to the field correcting and the spherical aberration correcting lenses in applications where such a choices of glass exists. It is expected that such use will favorably influence the achievable performance of designs embodying the present invention.

Figure 10:
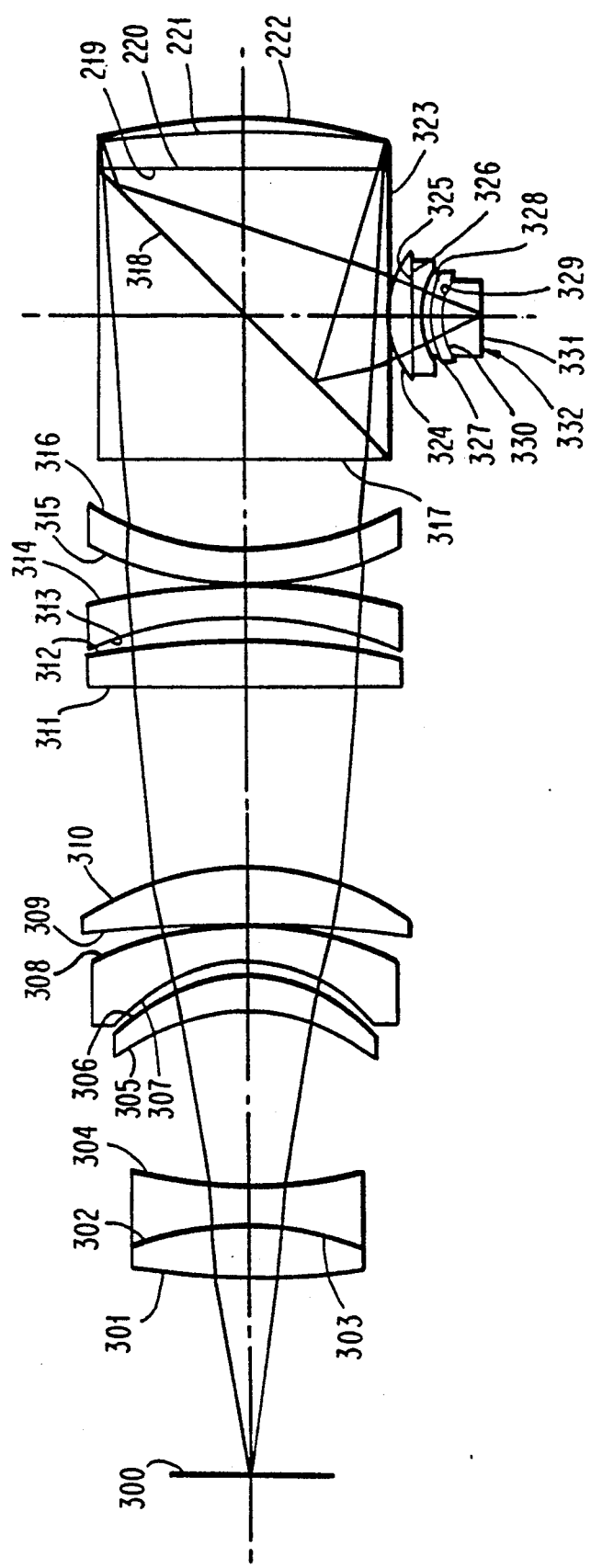
FIG. 10 is a specific embodiment of the apparatus schematically shown in FIG. 1 for a full field 4× reduction system.

FIG. 10 and Table 3 show another embodiment of the optical system of FIG. 1. FIG. 10 and Table 3 show a 4× reduction catadioptric relay lens having sub micron resolution over the total UV bandwidth of an excimer laser, for example, a KrF laser. The construction and parameters of the embodiment of FIG. 10 and Table 2 have a numerical aperture of 0.6 for a circular field of diameter 30 mm sufficient to cover a 2.0 mm² image field. The MTF through frequency and through focus, for the embodiment of FIG. 10 is similar to that shown for the embodiments of FIG. 2 and FIG. 6.

TABLE 3

|  | Surface | Radius Curvature mm | Thickness mm | Index of Refraction n = 1.5085507 a = 1.0 | One Half Diameter of Surface mm |
|---|---|---|---|---|---|
| Mask | 100 |  | 115.0 | a | 60.1 |
|  | 301 | 370.2948 | 30.0 | n | 67.9 |
|  | 302 | −196.6212 | 2.0 | a | 67.6 |
|  | 303 | −195.9992 | 21.0 | n | 67.1 |
|  | 304 | 281.8649 | 104.0 | a | 66.3 |
|  | 305 | −111.9241 | 21.0 | n | 72.7 |
|  | 306 | −100.9789 | 7.5 | a | 76.7 |
|  | 307 | −97.6046 | 21.0 | n | 76.5 |
|  | 308 | −189.1799 | 2.0 | a | 88.9 |
|  | 309 | −649.7924 | 34.0 | n | 93.4 |
|  | 310 | −159.9606 | 104.0 | a | 95.5 |
|  | 311 | 3078.1555 | 28.0 | n | 91.7 |
|  | 312 | −455.0276 | 12.0 | a | 91.2 |
|  | 313 | −238.3554 | 19.0 | n | 90.7 |
|  | 314 | −407.0824 | 2.0 | a | 91.7 |
|  | 315 | 204.3396 | 18.0 | n | 90.1 |
|  | 316 | 170.3065 | 53.0 | a | 86.1 |
| Cube Face | 317 |  | 85.0 | n |  |
| Cube Diagonal | 318 |  | 85.0 | n |  |
| Cube Face | 319 |  | 0 | a |  |
|  | 320 |  | 20.0 | n |  |
|  | 321 | 825.0556 | 7.5 | a | 84.5 |

TABLE 3-continued

| | Surface | Radius Curvature mm | Thickness mm | Index of Refraction n = 1.5085507 a = 1.0 | One Half Diameter of Surface mm |
|---|---|---|---|---|---|
| Mirror | 322 | 383.2405 | 7.5 | a | 84.7 |
| | 321 | 825.0556 | 20.0 | n | 84.5 |
| | 320 | | 0 | a | |
| Cube Face | 319 | | 85.0 | n | |
| Cube Diagonal | 318 | | 85.0 | n | |
| Cube Face | 323 | | 1.0 | a | |
| | 324 | 56.5102 | 12.0 | n | 34.5 |
| | 325 | 387.1705 | 0.25 | a | 33.7 |
| | 326 | −229.1068 | 5.0 | n | 32.8 |
| | 327 | 44.8281 | 6.2 | a | 26.9 |
| | 328 | 46.1373 | 7.5 | n | 25.1 |
| | 329 | 52.1721 | 2.0 | a | 22.6 |
| | 330 | 64.1946 | 19.6 | n | 22.2 |
| | 331 | 526.9378 | 0.5991 | a | 15.3 |
| Target | 332 | | | | |

Figure 11:
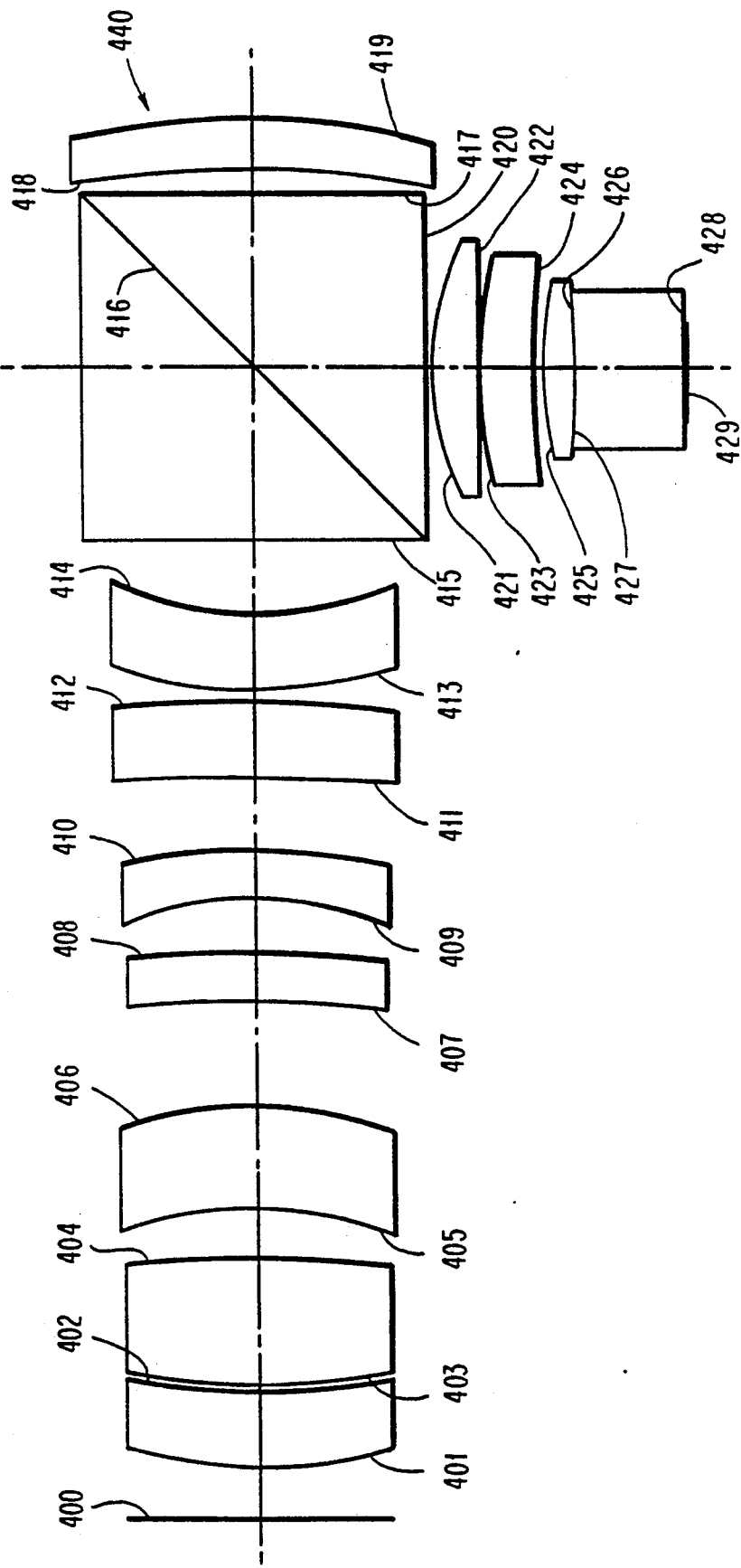
FIG. 11 and FIG. 12 are specific embodiments of the apparatus schematically shown in FIG. 1 for a full field 4× reduction systems incorporating a Mangin mirror.
Figure 12:
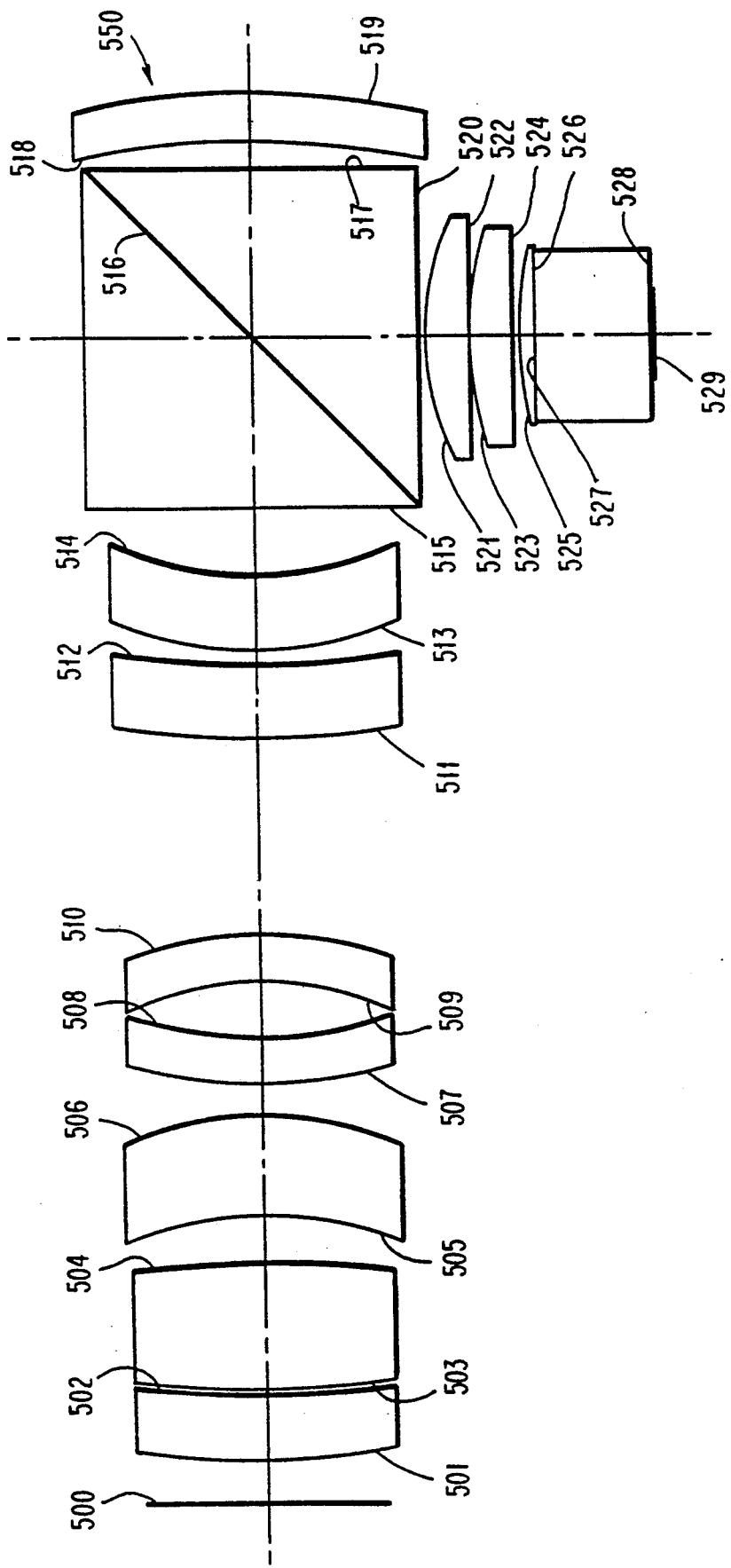

The embodiment of FIG. 11 having constructional parameters of Table 4 and the embodiment of FIG. 12 having constructional parameters of Table 5 incorporate Mangin mirrors 440 and 550 respectfully. The Mangin mirror (3) is used at conjugates giving substantially the desired reduction ratio of four. A air-spaced refracting group on the long conjugate side of the Magin mirror is complimented by a corrector group on short conjugate side of Mangin mirror. The optical system is designed with a beam splitting cube in its path to permit the image forming beam of light to clear the beam incident on the Mangin mirror, thereby having a two pass use of the optical path in the glass of the beamsplitting cube. Without this arrangement, there will always be present an obstruction in the pupil which is not recommended to be used in optical microlithography principally on account of variation in the size of obscuration with field leading to a non-uniform exposure dose falling on the silicon wafer. A high resolution reaching quarter micron is achievable with the high numerical aperture of 0.6 of this design.

For our present purposes, a Mangin mirror is taken to imply any meniscus lens concave towards the incident light with its rear surface coated with appropriate highly reflecting materials so that this surface acts as a mirror. A Mangin mirror with the stop at it mirror surface is used to work at substantially the desired reduction ratio and the desired high numerical aperture sufficient to provide substantially the desired high resolution.

The embodiment of FIG. 11 and Table 4 is a 4× reduction catadiptric relay lens having submicron resolution in the UV bandwidth having a numerical aperture of 0.6 for a circular field of diameter 13 mm which is sufficient to cover a 12×5 mm² image field.

The embodiment of FIG. 12 is a 4× reduction catadioptric relay lens having submicron resolution in the UV bandwidth and having aperture of 0.6 for a circular field of diameter 13 mm which is sufficient to cover a 12×5 mm² image field.

The MTF, through frequency and through focus, for the embodiment of FIGS. 11 and 12 are similar to that shown for the embodiments of FIGS. 2 and 6.

TABLE 4

| | Surface | Radius Curvature mm | Thickness mm | Index of Refraction n = 1.5607691 a = 1.0 | One Half Diameter of Surface mm |
|---|---|---|---|---|---|
| Mask | 400 | | 3.2 | a | 26.0 |
| | 401 | 90.5124 | 15.0029 | n | 27.1 |
| | 402 | 142.8582 | 1.5025 | a | 26.9 |
| | 403 | 182.2398 | 25.9982 | n | 26.9 |
| | 404 | −299.07 | 9.74 | a | 27.1 |
| | 405 | −86.3963 | 20.8177 | n | 26.6 |
| | 406 | −85.4725 | 21.4984 | a | 28.2 |
| | 407 | −241.1435 | 9.5051 | n | 26.2 |
| | 408 | −279.9286 | 11.3470 | a | 25.8 |
| | 409 | −65.7503 | 9.515 | n | 25.6 |
| | 410 | −122.0252 | 14.9563 | a | 27.1 |
| | 411 | −467.2583 | 15.0053 | n | 27.9 |
| | 412 | −421.69 | 3.0012 | a | 28.8 |
| | 413 | 92.35 | 15.0042 | n | 29.2 |
| | 414 | 64.0283 | 15.0038 | a | 27.7 |
| Cube Face | 415 | | 35 | n | |
| Cube Diagonal | 416 | | 35 | n | |
| Cube Face | 417 | | 5.0056 | a | |
| | 418 | −199.4415 | 10.0012 | n | 34.7 |
| Mirror | 419 | −161.8844 | 10.0012 | n | 35.2 |
| | 418 | −199.4415 | 5.0056 | a | 35.2 |
| Cube Face | 417 | | 35 | n | |
| Cube Diagonal | 416 | | 35 | n | |
| Cube Face | 420 | | .9026 | a | |
| | 421 | 57.6041 | 9.5017 | n | 25.8 |

TABLE 4-continued

| Surface | Radius Curvature mm | Thickness mm | Index of Refraction n = 1.5607691 a = 1.0 | One Half Diameter of Surface mm |
|---|---|---|---|---|
| 422 | 920.0489 | 0.4015 | a | 24.7 |
| 423 | 98.133 | 11.2929 | n | 23.4 |
| 424 | 316.5883 | 2.0022 | a | 20.1 |
| 425 | 92.5216 | 5.9018 | n | 18.1 |
| 426 | −502.4227 | 0.5 | a | 16.5 |
| 427 | −274.9772 | 21.9375 | n | 16.2 |
| 428 | 768.7248 | 0.1933 | a | 6.6 |
| Target 429 | | | | |

TABLE 5

| | Surface | Radius Curvature mm | Thickness mm | Index of Refraction n = 1.5085507 a = 1.0 | One Half Diameter of Surface mm |
|---|---|---|---|---|---|
| Mask | 500 | | 3.2 | a | 26.0 |
| | 501 | 123.3741 | 15.0029 | n | 26.9 |
| | 502 | 407.9745 | 0.5025 | a | 27.3 |
| | 503 | 247.922 | 25.9982 | n | 27.4 |
| | 504 | −301.6128 | 10.0065 | a | −26.9 |
| | 505 | −77.1852 | 20.9961 | n | 26.8 |
| | 506 | −72.9392 | 6.8449 | a | 28.1 |
| | 507 | 114.6524 | 9.5051 | n | 27.3 |
| | 508 | 89.3922 | 11.347 | a | 26.4 |
| | 509 | −60.3066 | 9.506 | n | 26.5 |
| | 510 | −86.8179 | 41.2581 | a | 28.1 |
| | 511 | 234.3202 | 15.0019 | n | 32.0 |
| | 512 | 194.5769 | 3.0012 | a | 32.0 |
| | 513 | 79.4623 | 15.0042 | n | 32.3 |
| | 514 | 62.2837 | 15.0058 | a | 30.4 |
| Cube Face | 515 | | 0 | n | |
| Cube Diagonal | 516 | | 0 | n | |
| Cube Face | 517 | | 5.0056 | a | |
| | 518 | −179.4187 | 10.0012 | n | 35.2 |
| Mirror | 519 | −158.6218 | 10.0012 | | |
| | 518 | −179.4187 | 5.0056 | a | 35.2 |
| Cube Face | 517 | | 35 | n | |
| Cube Diagonal | 516 | | 35 | n | |
| Cube Face | 520 | | 0.9026 | a | |
| | 521 | 52.4412 | 9.5028 | n | 23.4 |
| | 522 | 921.1127 | 0.4015 | a | 22.1 |
| | 523 | 85.1741 | 8.3991 | n | 21.0 |
| | 524 | 357.8853 | 2.0022 | a | 19.6 |
| | 525 | 87.1228 | 2.9024 | n | 17.7 |
| | 526 | −3505 | 0.5 | a | 17.0 |
| | 527 | −483.0228 | 24.2156 | n | 16.7 |
| | 528 | 429.6715 | 0.1903 | a | 6.6 |
| Target | 529 | | | | |

The very large size of the field achievable, particularly that of FIG. 6 and Table 2 and of FIG. 10 and Table 3, enables its use primarily in tools of optical microlithography known as steppers but does not prevent it from being applied in scanners of the ring field type or of the slot field type to build even larger fields. The very large field of the design also enables sub-die scanning to implement continuous throughout the field monitoring for better alignment and focus as a way to accommodate the naturally limited depth of focus of the design and also to take care of the demanding wafer flatness requirements for the ultra-high resolution optical microlithography of integrated circuits.

Examples of coatings, methods of fabricating the coatings and techniques for designing the coatings for the beam splitting surface 12 of the schematic diagram of FIG. 1 which are disposed on the beam splitting surfaces herein can be found in the patent application of Rosenbluth, in particular, the specific embodiments which have been incorporated herein by a reference herein above. The Rosenbluth coating include, but are not limited to, layers of hafnia, magnesium fluoride, alumina and silicone dioxide. Following the teaching of Rosenbluth the following beam splitter coating is for the embodiment of Table 2.

| 1) Alumina (Al2O3) | 226Å +/− 14Å |
| 2) Magnesium Fluoride (MgF2) | 432Å +/− 22Å |
| 3) Hafnia (HfO2) | 204Å +/− 10Å |
| 4) Magnesium Fluoride (MgF2) | 462Å +/− 24Å |
| 5) Alumina (Al2O3) | 209Å +/− 12Å |
| 6) Hafnia (HfO2) | 230Å +/− 10Å |

The right column is thickness in Angstroms. As the radiation propagates from the mask (input side) it is incident on layer #1 in the first (transmission) pass through the coating. After undergoing multiple reflections within the layers, the radiation emerges from layer #6. In the second (reflection) pass, the radiation is incident on layer #6. After reflection, it propagates towards the wafer.

Although the specific embodiments are for UV wavelengths, the general design of FIG. 1 is not limited thereto. Variations on the constructional parameters for the specific embodiments can be preferably ±20%, more preferably, ±10%, most preferably ±5%

In summary, the invention herein is an optical system of a NX reduction catadioptric relay lens having sub-half micron resolution over the total uv band width, in particular that of a UV excimer laser. A spherical mirror with a stop at the mirror is used to work at substantially the desired reduction ratio and the desired high numerical aperture sufficient to provide the desired high resolution. A beam splitting cube with appropriate coatings is essential to form an accessible image of an object which represents a mask used to pattern the substrate located at the image. Refracting correctors in the path of the slow beam incident on the mirror and in the path of the fast beam reflected from the mirror are designed to fix the aberrations of the image formed by the mirror.

It is to be understood that the above described embodiments are simply illustrative of the principles of the invention, various other modifications and changes may be devised by those of skill in the art which will embody the principles of the invention and fall within the spirit and scope thereof.

We claim:

1. An optical system comprising:
   an optical element composed of a material capable of supporting propagation of image-forming beams of radiation;
   said optical element having at least one substantially planar surface;
   a plurality of thin-film coatings on said substantially planar surface to provide a beam reflected from and transmitted through said surface which is substantially free of aberration, distortion and apodization due to reflection from and transmission through said surface;
   at least one concave reflective surface for receiving a beam reflected from or transmitted through said substantially plane surface;
   an input and output lens group to substantially correct for aberrations arising from reflection from said concave reflective surface; and
   said input and said output lens groups correct for aberrations to form a substantially distortion free image of wide field for ultraviolet light at high numerical aperture to form images having submicron resolution.

2. The system of claim 1, wherein each of said input and output lens groups contains a lens combination to correct for field curvature of said concave reflective surface and wherein each of said input and output lens groups contains a lens combination to correct for spherical aberrations of said concave reflective surface.

3. The system of claim 1, wherein said thin film coatings are composed of materials having substantially uniform thickness over said substantially planar surface to produce a compensating phase distribution and a compensating amplitude distribution in said beam reflected from said substantially plane surface and in said beam transmitted through said substantially plane surface, said compensating phase and amplitude distributions substantially correcting aberrations and distortions of said substantially planar surface and the coatings thereon.

4. The system of claim 1, further including a second optical element composed of a material capable of supporting the propagation of said image-forming beams of radiation, said second optical element having at least on substantially plane surface bonded to said thin film coatings on said first optical element, on the opposite side of said thin film coatings from said first optical element on which said thin film coating is layered.

5. The system of claim 4, wherein said first and said second optical elements are prisms, and said plane surface thereof are faces of said prisms, the combination of said first and second optical elements forming a beam splitting structure.

6. The system of claim 1, wherein said thin film coatings are selected from at least two of the group consisting of hafnia, magnesium floride, alumina and silicon dioxide.

7. The optical system of claim 1, wherein there are two of said at least one concave reflective surfaces, one of said two for receiving said beam transmitted through said substantially planar surface and the other of said two for receiving said beam reflected from said substantially planar surface.

8. An optical system comprising:
   an optical element composed of a material capable of supporting propagation of image-forming beams of radiation;
   said optical element having at least one substantially planar surface;
   a plurality of thin-film coatings on said substantially planar surface to provide a beam reflected from and transmitted through said surface which is substantially free of aberration, distortion and apodization due to reflection from and transmission through said surface;
   at least one concave reflective surface for receiving a beam reflected from or transmitted through said substantially plane surface;
   an input and output lens group to substantially correct for aberrations arising from reflection from said concave reflective surface;
   said input and said output lens groups correct for aberrations to form a substantially distortion free image of a wide field at high numerical aperture; and
   said high numerical aperture is less than about 0.7 and wherein said distortion free images are greater than about 0.25 microns in size.

9. An optical system comprising:
   an optical element composed of a material capable of supporting propagation of image-forming beams of radiation;
   said optical element having at least one substantially planar surface;
   a plurality of thin-film coatings on said substantially planar surface to provide a beam reflected from and transmitted through said surface which is substantially free of aberration, distortion and apodization due to reflection from and transmission through said surface;
   at least one concave reflective surface for receiving a beam reflected from or transmitted through said substantially plane surface;
   an input and output lens group to substantially correct for aberrations arising from reflection from said concave reflective surface; and
   said system has submicron resolution over the total ultraviolet band width of an excimer laser.

10. The system of claim 9, wherein said bandwidth is about 1 nanometer.

* * * * *